United States Patent [19]

Mallart

[11] Patent Number: 5,331,963
[45] Date of Patent: Jul. 26, 1994

[54] APPARATUS FOR EXAMINING OBJECTS BY ULTRASONIC ECHOGRAPHY

[75] Inventor: Raoul Mallart, Paris, France

[73] Assignee: U.S. Philips Corporation, New York, N.Y.

[21] Appl. No.: 906,084

[22] Filed: Jun. 29, 1992

[30] Foreign Application Priority Data

Jun. 28, 1991 [FR] France ............................. 91 08061

[51] Int. Cl.⁵ .............................................. A61B 8/00
[52] U.S. Cl. ................................. 128/661.01; 73/625
[58] Field of Search ................................... 128/661.01; 73/625–626, 602

[56] References Cited

U.S. PATENT DOCUMENTS

| | | | |
|---|---|---|---|
| 4,471,785 | 9/1984 | Wilson et al. | 73/602 |
| 4,607,218 | 8/1986 | Stosel | 324/83 D |
| 4,817,614 | 4/1989 | Hassler et al. | 128/660.05 |
| 4,989,143 | 1/1991 | O'Donnell et al. | 128/660.01 X |
| 5,184,623 | 2/1993 | Mallart | 128/661.01 |
| 5,203,336 | 4/1993 | Iida et al. | 128/661.01 X |

Primary Examiner—Francis Jaworski
Attorney, Agent, or Firm—Jack D. Slobod

[57] ABSTRACT

An apparatus for examining objects by ultrasonic echography includes an array of m ultrasonic transducer elements and a transmission stage having n transmission channels for causing n of the m transducer elements associated with an ultrasonic aperture to radiate echographic signals to the object and a receiving and processing stage having n receiving channels for receiving and processing echographic signals returned by the object being examined. The transmission and the receiving and processing stages include transmission-mode and receiving-mode circuits, respectively, for focusing by the provision of suitable focusing delays in the n channels of each. The receiving and processing stage includes a stage for determine after a first burst, $(n-1)$correction values for the focusing delays, and a circuit for correcting the focusing delays as a function of the $(n-1)$ correction values thus determined. The stage for determining focusing delay correction values includes, in parallel, $(n-1)$ correction determining circuits, each separately receiving two focused echographic signals in adjoining channels for determining a focusing delay correction value for one of the two channels.

5 Claims, 3 Drawing Sheets

APPARATUS FOR EXAMINING OBJECTS BY ULTRASONIC ECHOGRAPHY

BACKGROUND OF THE INVENTION

The invention relates to an apparatus for examining objects by ultrasonic echography, including an array of m ultrasonic transducer elements associated with a stage for the transmission of ultrasonic signals to the object to be examined and with a stage for receiving and processing echographic signals returned to the transducer elements by the object being examined, the transmission stage and receiving and processing stage respectively including means for focusing by the provision of suitable delays in n transmission channels in n receiving channels associated with n transducer elements, among said m elements, forming an ultrasonic aperture, the receiving and processing stage further including.

associated with the n receiving channels, means for determining (n−1) correction values for the focusing delays; and means for the correction of the focusing delays as a function of the (n−1) values thus determined.

The operating principle of current echographs is generally based on the assumption that the velocity of ultrasonic waves in the tissues being examined is constant, particularly to enable the different delays due to beam focusing and inclination to be computed and to enable the information relating to the transit times of the echoes to be converted into depth information. However, this assumption is seldom true: the propagation velocity of ultrasonic waves has, for example, an average value of 1540 m/s in the liver and is approximately 1300 m/s in fatty tissues. This results essentially in a defocusing of the ultrasonic beams, both in the transmission and the receiving mode, leading to loss of resolution and contrast of the images, which loss increases as larger focusing apertures and waves of higher frequency are used. The influence of the frequency on the resulting degradation can be understood when bearing in mind that an accuracy of approximately one eighth of a wavelength is to be observed for the delays, i.e. an accuracy which improves as the frequency increases, while the influence of the aperture size can be explained by bearing in mind that the probability of zones of different velocities of sound being encountered increases as the aperture is larger.

A solution adopted to reduce the disturbances as a result of such a defocussing is to compare the received echographic signals by correlation. U.S. Pat. No. 4,471,785 describes an apparatus in which, in order to cope with differences in the velocity of ultrasonic waves in the objects being examined and the resulting image artefacts, a correlator arranged in parallel with n reception channels enables (n−1) focusing delay correction values to be determined, which values are applied to delay lines in these reception channels and which, prior to combination of the echographic signals, modify in a specific way the delays introduced by said lines in each channel in view of receiving-mode focusing.

SUMMARY OF THE INVENTION

It is the object of the invention to provide an echograph of simpler construction, which no longer employs correlators to determine the correction values for the focusing delays.

To this end, according to the invention, an apparatus of the type defined in the opening paragraph is characterized in that said determining means comprise, in parallel, (n−1) correction determining circuits each separately receiving two of the n focused echographic signals in adjoining channels, the signals received by the $i^{th}$ circuit referred to herein as being of successive ranks (i) and (i+1), for respectively determining each of said (n−1) correction values, each of said circuits, comprising:

a stage for generating a time window signal defining a time window during which the $i^{th}$ corresponding correction value is determined;

a stage for determining, the phase shift between the focused echographic signals of the ranks (i) and (i+1) received by said correction circuit, said phase shift constituting the $i^{th}$ corresponding correction value to be determined during the time period or being directly related to it.

BRIEF DESCRIPTION OF THE DRAWING

The invention will be described in more detail hereinafter with reference to the accompanying drawings in which.

DETAILED DESCRIPTION OF THE PREFERRED EMBODIMENTS

Figure 1A:
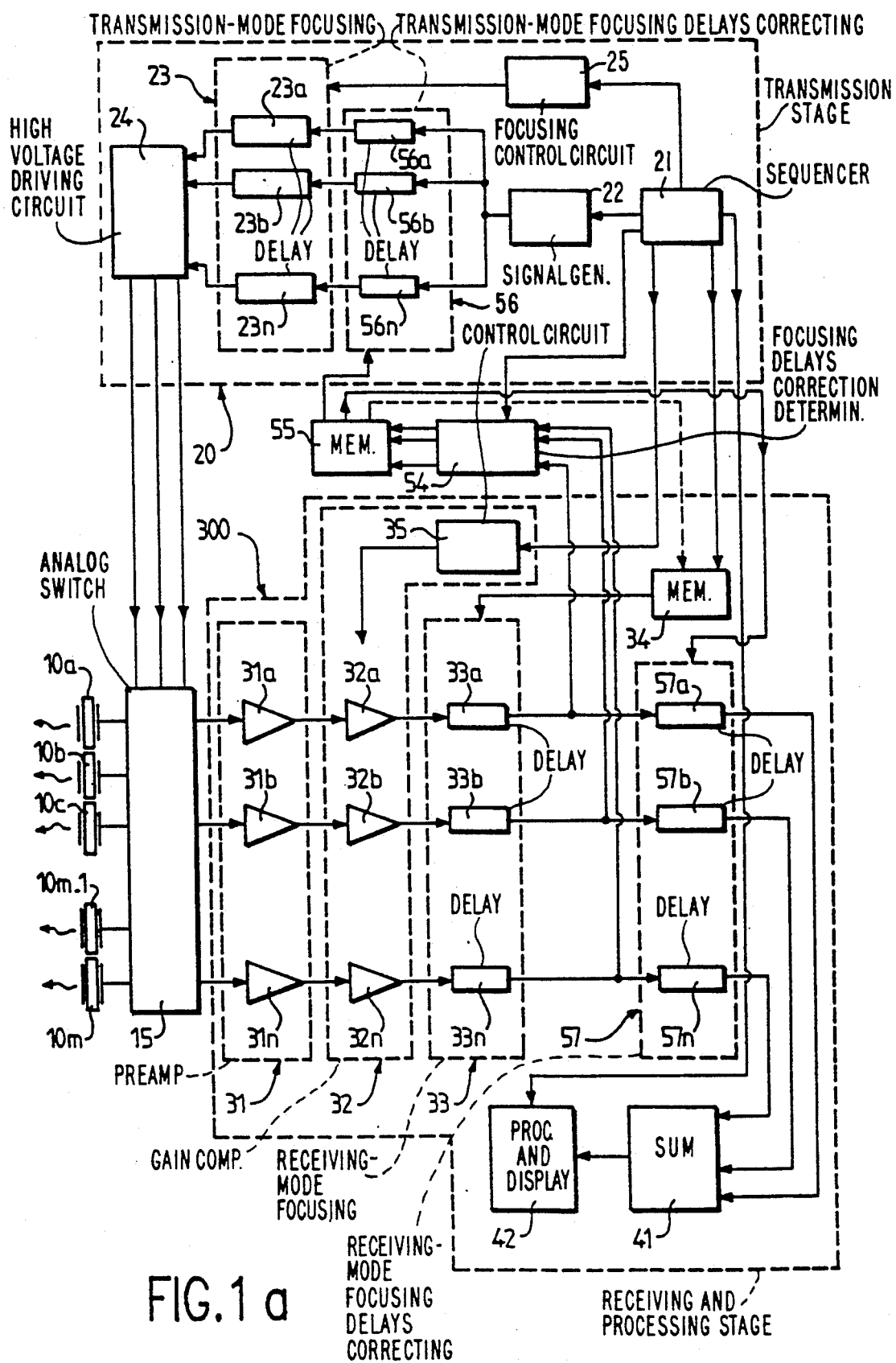
FIG. 1a shows an example of an ultrasonic echography apparatus comprising a focusing correction stage in accordance with the invention.

The ultrasonic echography apparatus shown in FIG. 1a first of all comprises a transducer device comprising an array of m ultrasonic transducers 10a to 10m connected to an analog switch 15 which enables the aperture to be defined. The other end of this switch 15 is connected to a transmission stage 20 and to a receiving and processing stage 300.

In the present case the transmission stage 20 comprises the following elements:

(a) a sequencer circuit 21 defining the rhythm of the ultrasonic bursts having, for example, a repetition rate of the order of 3 to 5 kHz, which circuit comprises basically on oscillator and a frequency divider to supply the various clock signals required;

(b) at the output of the sequencer circuit 21 a circuit 22 for the transmission or generation of electric signals for the excitation of the transducers, which excitation is controlled either as a function of time to allow the ultrasonic signals to be focused or, conversely, in phase, in which case the different focusing delays are obtained (as in the example shown in FIG. 1a) by means of n delay lines 23a to 23n arranged after the circuit 22, in the respective n transmission channels associated with n transducers used for transmission (n being smaller than m);

(c) if focusing is not effected by means of the circuit 22 (as indicated in (b)) the n delay lines 23a to 23n form an electronic focusing circuit 23;

(d) a high voltage driving circuit 24 supplying high voltage pulses to drive the transducers.

The sequencer circuit 21 supplies not only the pulses for synchronising the ultrasonic bursts but also the control signals for a transmission-mode focusing control circuit 25. This circuit 25 stores the sequence of transmission delay functions for each transducer, which sequence is adapted to ensure that the configuration of the delay lines 23a to 23n of the focusing circuit 23 is in accordance with a predetermined function for each burst.

Figure 1B:
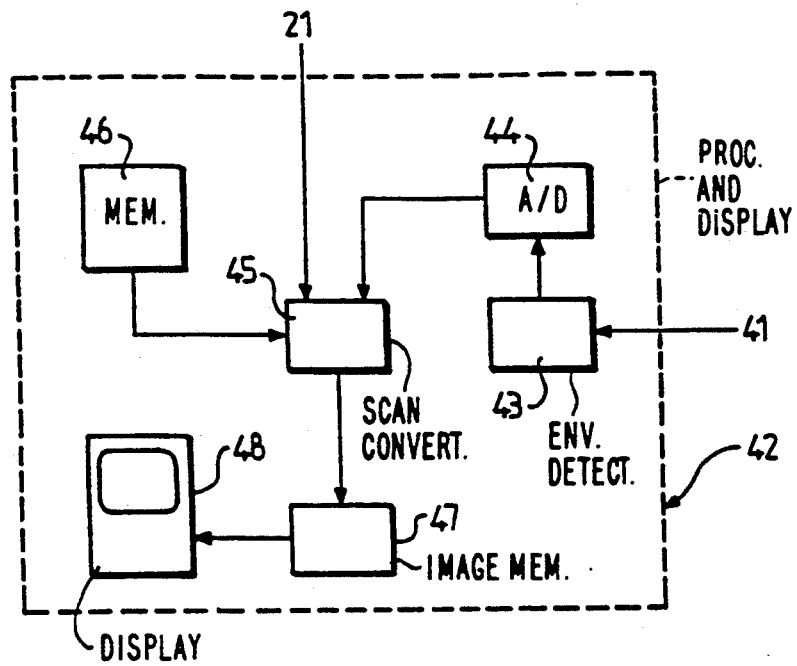
FIG. 1b shows the processing and display unit of said echography apparatus.

The receiving and processing stage 300 comprises n receiving and processing channels, which in the present case each comprise in succession the following elements:

(a) preamplifiers 31a to 31n, the n preamplifiers together forming a preamplifier circuit 31 which receives the n echographic signals corresponding to the aperture of the transducer array;

(b) a circuit 32 for gain compensation as a function of time, which circuit basically comprises n amplifiers 32a to 32n whose gain is variable as function of time and which are controlled by a control circuit 35, which receives synchronising pulses from the sequencer circuit 21;

(c) the delay lines 33a to 33n, which together form a receiving-mode focusing circuit 33 (dynamic focusing) coupled to a memory 34 which is controlled by the sequencer circuit 21 and, for each channel, stores all the delay functions for each focusing zone and for each image line;

(d) a summing device 41, which receives the outputs of the n receiving and processing channels thus formed;

(e) a processing and display unit 42 for obtaining the slice images of the object being examined, which unit is shown in FIG. 1b and basically comprises:
an envelope detector 43 which receives the output from the detector 41 and is followed by an analog-to-digital converter 44;
a scan converter 45 which receives both the output of the analog-to-digital converter 55 and the output of a memory 46 defining the positions of the scanned lines relative to the transducer device, and also the synchronising signals then still supplied by the sequencer circuit 21;
an image memory 47 serving as a buffer for the storage of the output signals of the scan converter 45 and whose output signals, after they have been read out of this memory, are reproduced on a display screen 48.

Figure 2A:
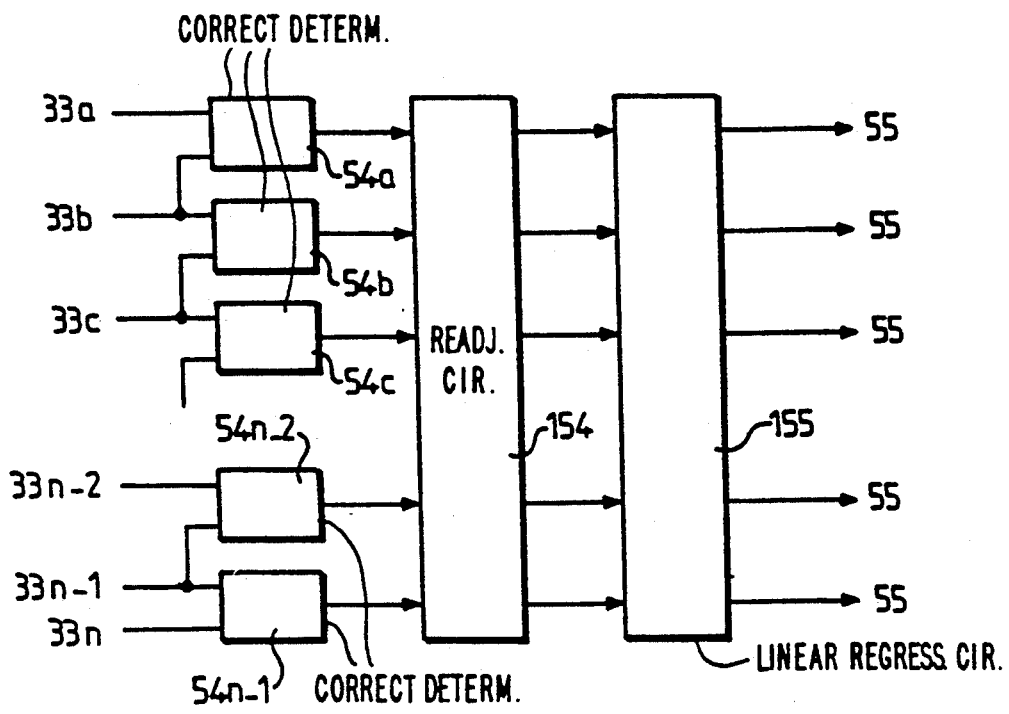
FIG. 2a shows in more detail the focusing correction stage of the apparatus in accordance with the invention.

In accordance with the invention the receiving and processing stage 300 also comprises, associated with the n receiving and processing channels, a focusing delays correction determining stage 54 shown in more detail in FIG. 2a. As is shown in this Figure, the stage 54 comprises (n−1) correction determining circuits 54a to 54n−1 arranged in parallel, which circuits each receive two of the focused echographic signals and are shown in more detail in FIG. 2b, which by way of example shows the correction determining circuit 54i.

Figure 2B:
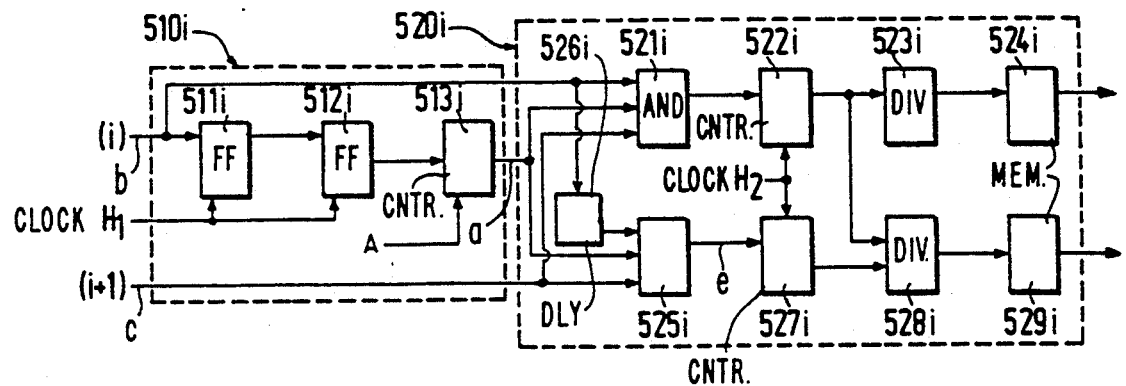
FIG. 2b shows one of the correction circuits of said stage.
Figure 3:
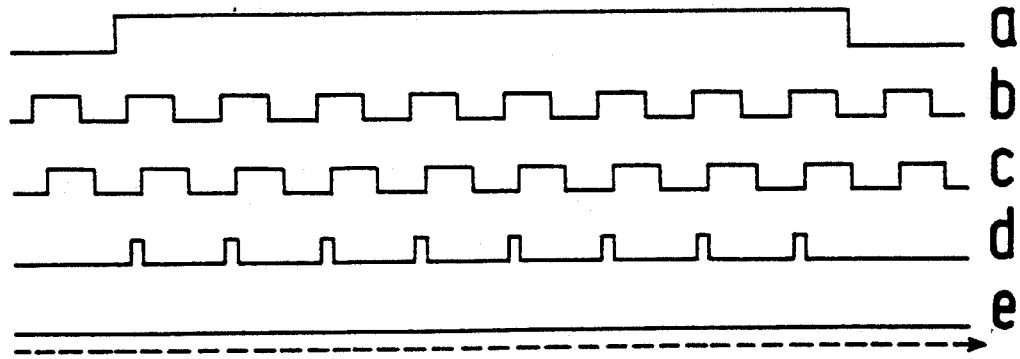
FIG. 3 shows signal waveforms on lines a through e appearing at points a through e, respectively, of the circuit shown in FIG. 2b.

In the present example this circuit 54i first of all comprises a stage 510i for opening a time window, which stage receives the echographic signals of the ranks (i) and (i+1) and is adapted to generate a time winder signal shown in FIG. 3, line a (FIG. 3 shows the signal waveforms appearing at various points in the circuit 54i in FIG. 2b). The stage 510i comprises successively:

two flip-flops 511i and 512i in series adapted to filter the echographic signal of the rank (i) in order to eliminate any spurious flanks of this signal (the flip-flop 511i receives said echographic signal and a clock signal $H_1$ of, in the present case, 18 MHz from the sequencer circuit 21, and the flip-flop 512i receives the output signal of the flip-flop 511i and said clock signal);

a first counter 513i which receives the filtered signal appearing on the output of the flip-flop 512i and which is adapted to count the number of pulses of the echographic signal thus filtered after the window defined by the signal shown in FIG. 3, line a has been opened (opening being controlled by a signal A from the sequencer circuit 21), in order to close said window after a given number of periods of this echographic signal (preferably 8 to 16).

The echographic signals of the ranks (i) and (i+1) are shown in FIG. 3, lines a and c, respectively. It is to be noted that the echographic signals are obtained after 1-bit analog-to-digital conversion of the analog echographic signals supplied by the receiving-mode processing channels, which explains the rectangular shape.

The circuit 54i shown also comprises a phase-shift determining stage 520i comprising a circuit for determining the absolute value of the phase shift between the echographic signals of the ranks (i) and (i+1) and a circuit for determining the sign of this phase shift.

The circuit for determining the absolute value comprises an AND gate 521i, which receives the two signals of the ranks (i) and (i+1) as well as the time window signal and, when the last-mentioned signal has the level corresponding to opening of said window (in the present case the high level), supplies a digital signal whose magnitude is proportional to the absolute value of the phase shift between the signals of the ranks (i) and (i+1). The output signal of this AND gate 521i is shown in FIG. 3, line d. This gate is followed by a second counter 522i. By means of this counter 522i, which receives from the sequencer circuit 21 a clock signal $H_2$ having the sampling frequency of the signals of the rank i (i+1), in the present case 40 MHz, it is possible to determine the total length of time during which the output of the AND gate 521i is high, i.e. the sum of the intervals corresponding to the high level of the pulses shown in FIG. 3, line d. The counter 522i is followed by a divider 523i (in the present case a divide-by-8 or 16 divider). In fact, the dividing ratio of the divider 5623i is identical to the given number of periods of the filtered echographic signal appearing within the time window generated by the stage 510i, and this division boils down to determining the average duration of one of the pulses shown in FIG. 3, line d. Finally, a first memory 524i enables the output signal of the divider 523i to be stored, which signal corresponds to the absolute value of the phase shift to be determined.

Likewise, the circuit for determining the sign of this phase shift comprises an AND gate 525i, which also receives the two signals of the ranks (i) and (i+1), one of which has been delayed by one period of the sampling clock by a delay circuit 526i, and the time window signal, the output signal of this gate being shown in FIG. 3, line e. This AND gate 525i is followed by a third counter 527i, which counter is followed by a comparator 528i. As in the foregoing, the counter 527i, which also receives the clock signal $H_2$, determines the total length of time during which the output of the AND gate 525i is high. As a result of the delay introduced by the circuit 526i this time differs from that determined by the counter 522i. By comparing these two lengths of time and allowing for the initial relative positions of the signals of the ranks i and (i+1) (in the absence of said delay introduced by the circuit 526i), the sign of the phase shift is determined. As in the case of the circuit for determining the absolute value the comparator 528i is followed by a second memory 529i, which eventually enables the output signal of this comparator, corresponding to the sign of the phase shift, to be stored.

Each correction circuit such as 54i thus enables the delay between the two echographic signals to be determined (since these signals are focused dynamically from the first actuation this focusing during this first actuation is effected simply as though there are no inhomogeneities in the object under examination). The (n−1) delay values thus supplied by the (n−1) correction circuits 54a to 54n−1 are then processed together, as indicated in FIG. 2a, in a readjustment circuit 154, which readjusts these values relative to a common reference (for example relative to the first channel, but this may be relative to any one of the channels). The readjustment circuit 154 is followed by a circuit 155 for the linear regression upon the (n−1) readjusted values in order to eliminate the linear offset caused by the possible presence of targets situated off the focusing axis (the order in which this readjustment and elimination of linear offset are effected is given merely by way of example and may be changed).

In the present example the (n−1) outputs of the circuit 155 thus form the outputs of the focusing correction stage 54. The delays thus computed are stored in a memory circuit 55 and subsequently, before the next burst is triggered, they are introduced into the transmission channels by means of delay lines 56a to 56n forming a transmission-mode focusing delays correcting circuit 56 arranged just before the electronic focusing circuit 23. A new transmission may then be effected, which in the transmission-mode focusing allows for the corrections thus applied to the delays of each transmission channel. Upon reception of the echographic signals corresponding to this new burst, the delays between these signals are again determined in same way as above and are subsequently reintroduced into each transmission channel just before the next burst. In this way an iterative correction is obtained for differences in the velocity of ultrasonic waves in the objects being examined.

Obviously, the present invention is not limited to the present exemplary embodiments, which may be modified without departing from the scope of the invention. For example, it is very well possible to interrupt the described iterative correction process when said correction is found to be effective and adequate. This interruption may be effected, for example, either after a predetermined number of bursts or on the basis of an interruption criterion. The interruption may be effected, for example, when the energy of the echographic line exceeds a predetermined threshold. This energy may be considered to be maximal when the focusing is correct in the transmission mode and in the receiving mode. An interruption control circuit, not shown, but arranged for example before the correction stage 54, is then provided to realise this modification. Moreover, it is to be noted that the iterative correction in accordance with the invention, by the successive cycling of correction information, can be achieved both when the transmission and/or the receiving channels are digital and when they are analog, in which case an analog-to-digital converter is arranged in series in each of said channels, for example at the output of the circuit 32 for gain compensation as a function of time. This modification is not shown because its construction is easy to derive from FIG. 1a.

It is to be noted also that the computed delays stored in the memory circuit 55 can be reintroduced not only into the transmission channels but also into the receiving and processing channels during the next burst, or can also be reintroduced immediately into the receiving and processing channels by means of a receiving-mode focusing delays correction circuit 57 while the burst in progress is not finished. In the present case the circuit 57 in the stage 300 comprises delay lines 57a to 57n arranged in series in each of the receiving and processing channels, the circuit 55 and this circuit 57 being coupled by an additional output connection.

Finally, it is to be noted that the signals A, $H_1$, $H_2$ are of course applied to each of the (n−1) correction circuits 54a to 54n−1 in FIG. 2a.

I claim:

1. Apparatus for examining objects by ultrasonic echography, comprising an array of m ultrasonic transducer elements, where m is a positive integer, a transmission stage, having n transmission channels, where n is a positive integer less than or equal to m, associated with n transducer elements, among said m elements, defining an ultrasonic aperture, said transmission stage together with said array of transducer elements being means for transmission of ultrasonic signals to the object to be examined, a receiving and processing stage, having n receiving channels associated with said n transducer elements, said receiving and processing stage together with said array of transducer element being means for receiving and processing echographic signals returned to said n transducer elements by the object being examined, said transmission stage comprising transmission-mode means for focusing by the provision of suitable delays in said n transmission channels and said receiving and processing stage comprising receiving-mode means for focusing by the provision of suitable delays in said n receiving channels, the receiving and processing stage further comprising:

associated with said n receiving channels, means for determining (n−1) correction values for the focusing delays; and means for correcting said focusing delays as a function of the (n−1) correction values thus determined;

wherein said determining means comprises, in parallel, (n−1) correction circuits each correction circuit being coupled for receiving two focused echographic signals from a different pair of outputs, in $i^{th}$ and $(i+1)^{th}$ adjoining channels, where i is a positive integer less than n, of the receiving-mode focusing means and each of said correction circuits being means for determining an $i^{th}$ of said (n−1) correction values, each correction circuit comprising:

means for generating a time window signal defining a time window during with the $i^{th}$ correction value is determined; and means for determining, during said time window, a phase shift between the two focused echographic signals received by said correction circuit, said phase shift constituting the $i^{th}$ correction value or being directly related to it, said determining means not including any correlators.

2. An apparatus as claimed in claim 1, wherein said means for generating a time window signal comprises:

means for filtering said focused echographic signal in the $i^{th}$ channel to form a filtered focused echographic signal, which filtering means comprises two flip-flops in series, which two flip-flops also receive a clock signal $H_1$; and a first counter having an output for said time window signal and having an input coupled to an output of said filtering means for receiving said filtered focused echographic signal and a further input for receiving a signal for opening the time window defined by said time window signal, said counter being means for counting a number of pulses of said filtered echographic signal, which pulses are to be accommodated within the time window defined by said time window signal.

3. An apparatus as claimed in claim 2, wherein said means for determining the phase shift comprises, in series:

means for determining the absolute value of said phase shift comprising a first AND gate which receives said time window signal from said generating means and the two focused echographic signals in the $i^{th}$ and $(i+1)^{th}$ channels, a second counter for determining a total duration of time for which said first AND gate is held at its high level during the time window, a divider for dividing by the number of periods during which the output of said gate is held at said high level, and a first memory; and means for determining the sign of said phase shift comprising a second AND gate, a third counter, a divider, and a second memory, which second AND gate also receives said time window signal, the focused echographic signal in the $(i+1)^{th}$ channel, and the focused echographic signal in the $i^{th}$ channel via a delay circuit.

4. An apparatus as claimed in claim 1, wherein said means for determining the phase shift comprises, in series:

means for determining the absolute value of said phase shift comprising a first AND gate which receives said time window signal from said generating means and the two focused echographic signals in the $i^{th}$ and $(i+1)^{th}$ channels, a first counter for determining the total duration of time for which said first AND gate is held at its high level during the time window, a divider for dividing by the number of periods during which the output of said gate is held at said high level, and a first memory; and means for determining the sign of said phase shift comprising a second AND gate, a second counter, a divider, and a second memory, which second AND gate also receives said time window signal, the focused echographic signal in the $(i+1)^{th}$ channel, and the focused echographic signal in the $i^{th}$ channel via a delay circuit.

5. An apparatus as claimed in any one of claims 1 to 4 and 3, wherein said $(n-1)$ correction values are supplied to said correcting means via a readjustment circuit which generates $(n-1)$ readjusted correction values and means for performing a linear regression upon the $(n-1)$ readjusted correction values.

* * * * *